(12) United States Patent
Tam et al.

(10) Patent No.: US 8,368,214 B2
(45) Date of Patent: Feb. 5, 2013

(54) ALPHA SHIELDING TECHNIQUES AND CONFIGURATIONS

(75) Inventors: Nelson Tam, Belmont, CA (US); Albert Wu, Palo Alto, CA (US); Chien-Chuan Wei, Sunnyvale, CA (US)

(73) Assignee: Marvell World Trade Ltd., St. Michael (BB)

( * ) Notice: Subject to any disclaimer, the term of this patent is extended or adjusted under 35 U.S.C. 154(b) by 448 days.

(21) Appl. No.: 12/628,059

(22) Filed: Nov. 30, 2009

(65) Prior Publication Data
US 2010/0140760 A1 Jun. 10, 2010

Related U.S. Application Data

(60) Provisional application No. 61/120,976, filed on Dec. 9, 2008, provisional application No. 61/122,197, filed on Dec. 12, 2008.

(51) Int. Cl.
*H01L 23/48* (2006.01)
*H01L 23/52* (2006.01)
*H01L 29/40* (2006.01)

(52) U.S. Cl. ......... 257/738; 257/737; 257/739; 257/780
(58) Field of Classification Search ........... 257/737–780
See application file for complete search history.

(56) References Cited

U.S. PATENT DOCUMENTS

| | | | |
|---|---|---|---|
| 6,287,893 B1 * | 9/2001 | Elenius et al. | 438/108 |
| 6,894,390 B2 * | 5/2005 | Schammler et al. | 257/738 |
| 7,495,317 B2 | 2/2009 | Song et al. | |
| 2002/0121692 A1 * | 9/2002 | Lee et al. | 257/737 |
| 2003/0119300 A1 * | 6/2003 | Chiu et al. | 438/615 |
| 2005/0032349 A1 * | 2/2005 | Lee et al. | 438/614 |
| 2005/0170630 A1 * | 8/2005 | Kuo et al. | 438/613 |

FOREIGN PATENT DOCUMENTS

CN 1909223 A 2/2007

* cited by examiner

Primary Examiner — Telly Green

(57) ABSTRACT

Embodiments of the present disclosure provide an apparatus including a semiconductor die having a plurality of integrated circuit devices, a pad structure electrically coupled to at least one integrated circuit device of the plurality of integrated circuit devices via an interconnect layer, an electrically insulative layer disposed on the interconnect layer, a first shielding structure disposed in the electrically insulative layer and electrically coupled to the pad structure, an under-ball metallization (UBM) structure electrically coupled to the first shielding structure, and a solder bump electrically coupled to the UBM structure, the solder bump comprising a solder bump material capable of emitting alpha particles, wherein the first shielding structure is positioned between the solder bump and the plurality of integrated circuit devices to shield the plurality of integrated circuit devices from the alpha particles. Other embodiments may be described and/or claimed.

10 Claims, 4 Drawing Sheets

ALPHA SHIELDING TECHNIQUES AND CONFIGURATIONS

CROSS REFERENCE TO RELATED APPLICATIONS

The present application claims priority to U.S. Provisional Patent Application No. 61/120,976, filed Dec. 9, 2008, and U.S. Provisional Patent Application No. 61/122,197, filed Dec. 12, 2008, the entire specifications of which are hereby incorporated by reference in their entireties for all purposes, except for those sections, if any, that are inconsistent with this specification.

TECHNICAL FIELD

Embodiments of the present disclosure relate to the field of integrated circuits, and more particularly, to packaging configurations for integrated circuits, and associated fabrication methods.

BACKGROUND

Solder bumps are widely used to connect a semiconductor die with a package substrate (e.g., flip-chip packaging) to form a "package." Many solderable materials for solder bump applications including, for example, solder paste, have radioactive impurities that undergo radioactive decay, emitting alpha particles in the process. The emitted alpha particles can strike an integrated circuit (IC) device, such as a memory cell formed on a surface of the semiconductor die, changing the state of the IC device and resulting in potentially corrupted data. Even if the solderable material is an ultra-low alpha grade material $$\left(e.g., 0.001 - 0.002 \, \frac{particles}{cm^2 \cdot hr}\right),$$

contamination from manufacturing operations associated with fabricating and/or packaging the semiconductor device can significantly increase alpha particle emission and, thus, increase data corruption of the IC device.

The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

The present disclosure provides an apparatus including a semiconductor die having a plurality of integrated circuit devices, a pad structure electrically coupled to at least one integrated circuit device of the plurality of integrated circuit devices via an interconnect layer, an electrically insulative layer disposed on the interconnect layer, a first shielding structure disposed in the electrically insulative layer and electrically coupled to the pad structure, an under-ball metallization (UBM) structure electrically coupled to the first shielding structure, and a solder bump electrically coupled to the UBM structure, the solder bump comprising a solder bump material capable of emitting alpha particles, wherein the first shielding structure is positioned between the solder bump and the plurality of integrated circuit devices to shield the plurality of integrated circuit devices from the alpha particles.

According to various embodiments, the apparatus further includes a second shielding structure coupled to a surface of the electrically insulative layer proximal to the solder bump and electrically isolated from the solder bump, wherein the second shielding structure is positioned to shield the plurality of integrated circuit devices from the alpha particles.

According to various embodiments, the apparatus further includes a package substrate electrically coupled to the plurality of integrated circuit devices via the solder bump; and an underfill material used to facilitate electrical isolation of the second shielding structure from the solder bump.

The present disclosure further provides a method that includes depositing an electrically insulative material on a pad structure of a semiconductor die, patterning the electrically insulative material to expose the pad structure, depositing a metal on at least a portion of the pad structure to form a first shielding structure; and depositing the electrically insulative material to encapsulate the first shielding structure.

According to various embodiments, said depositing a metal on at least a portion of the pad structure comprises sputtering a seed layer on at least a portion of the pad structure, and plating the seed layer using the metal.

According to various embodiments, the method further includes patterning the electrically insulative material to expose at least a portion of the first shielding structure; and selectively depositing a metal on a surface of the electrically insulative material to form a second shielding structure.

According to various embodiments, said selectively depositing a metal further comprises selectively depositing the metal on at least a portion of the first shielding structure to form an under-ball metallization (UBM) structure.

According to various embodiments, the method further includes attaching a solder bump to the UBM structure, the solder bump comprising a solder bump material capable of emitting alpha particles, the second shielding structure being coupled to a surface of the electrically insulative material proximal to the solder bump and being electrically isolated from the solder bump, wherein the first shielding structure and the second shielding structure are positioned between the solder bump and integrated circuit devices formed on the semiconductor die to shield the integrated circuit devices from alpha particles emitted by the solder bump.

According to various embodiments, the method further includes curing the electrically insulative material deposited on the pad structure and deposited to encapsulate the first shielding structure after patterning the electrically insulative material to expose at least a portion of the first shielding structure.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques and configurations to shield integrated circuit (IC) devices from alpha particle emissions. In the following detailed description, reference is made to the accompanying drawings which form a part hereof, wherein like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, back/front, over/under, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
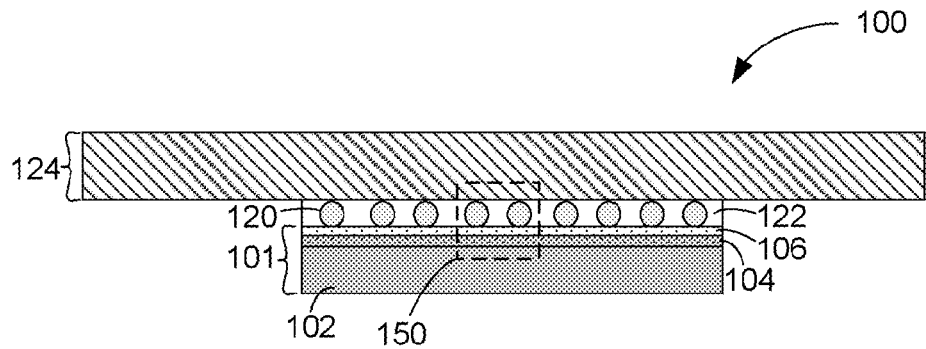
FIG. 1 schematically illustrates an elevation view of a package configuration including a semiconductor die and a package substrate, in accordance with various embodiments.

FIG. 1 schematically illustrates an elevation view of a package configuration 100 including a semiconductor die 101 and a package substrate 124, in accordance with various embodiments. In one embodiment, the package configuration 100 is a flip-chip package. Other types of package configurations that benefit from embodiments described herein can be used in other embodiments.

The package configuration 100 includes a semiconductor die 101. The semiconductor die 101 is intended to represent a variety of IC chips including, for example, memory and/or logic for storing and/or processing information. The semiconductor die 101 includes IC devices 104, such as memory cells and/or transistors. The IC devices 104 are typically formed on a semiconductor substrate 102, such as a silicon substrate, in a series of manufacturing operations. Interconnect layers 106 are fabricated to electrically couple the IC devices 104 to other external devices, such as package substrate 124, for delivery of power and/or I/O signals to the IC devices 104.

The IC devices 104 of the semiconductor die 101 are electrically coupled to the package substrate 124 via solder bumps 120 (only one of which is numerically labeled for clarity), which can be any of a variety of suitable interconnect structures that benefit from the principles described herein. For example, the solder bumps 120 can include a variety of shapes including spherical and cylindrical shapes. The solder bumps 120 can be made of a variety of solderable materials. The solder bumps 120 can include, for example, lead (Pb) and/or tin (Sn), or alloys of such materials. The solder bump material, or other similar material such as solder paste (not shown), that is used to electrically couple the semiconductor die 101 with the package substrate 124 includes radioactive impurities that emit alpha particles as part of a radioactive decay process. In one embodiment, the solder bump material has an alpha particle flux greater than about $$0.001 \frac{\text{particles}}{\text{cm}^2 \cdot \text{hr}}.$$

The package substrate 124 typically includes traces or other type of lead (not shown) coupled to the solder bumps 120 to electrically couple the IC devices 104 to one or more other electronic components of an electronic system. The package substrate 124 can include a printed circuit board (PCB) or other similar type of substrate. An underfill material 122 may be deposited to fill a region between the semiconductor die 102 and the package substrate 124, as illustrated. The solder bumps 120 may be encapsulated and/or sealed by the underfill material 122.

Dashed region 150 indicates an example region of the package configuration 100 that is described in greater detail in connection with the package configuration 200 of FIG. 2 and the package configuration 300 of FIG. 3 according to various embodiments of the present disclosure.

Figure 2:
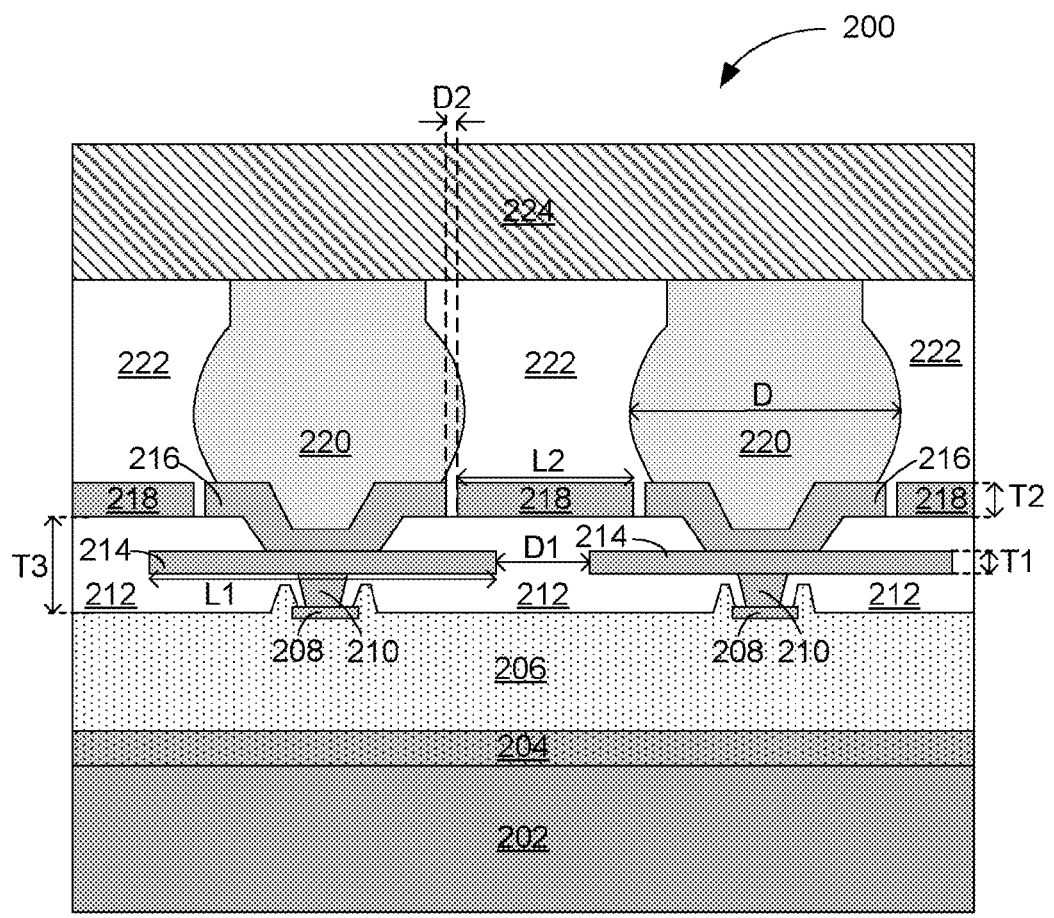
FIG. 2 schematically illustrates an elevation cross-section view of a package configuration, in accordance with various embodiments.

FIG. 2 schematically illustrates an elevation cross-section view of a package configuration 200. The package configuration 200 includes a semiconductor substrate 202 having a plurality of IC devices 204 formed thereon. The IC devices 204 are electrically coupled to one or more pad structures 208. For example, interconnect layers 206 are typically fabricated to electrically couple the IC devices 204 to the pad structures 208. The interconnect layers 206 typically include successive layers of metal line structures and metal via structures (not shown) formed in a dielectric material such as, for example, silicon oxide, but can include any other suitable structure to electrically interconnect the IC devices 204 to the pad structures 208.

The pad structures 208 typically include a substantially flat surface to make electrical contact. The pad structures 208 can be fabricated from materials such as aluminum or copper, but are not limited to these materials. Other suitable electrically conductive materials can be used in other embodiments. The pad structures 208 are electrically coupled to the IC devices 204 (e.g., using interconnect layers 206).

An electrically insulative layer 212 is formed over, disposed on, and coupled to the interconnect layers 206 and the pad structures 208, as illustrated. In one embodiment, the electrically insulative layer 212 comprises polyimide. Other suitable materials can be used in other embodiments. The electrically insulative layer 212 can further function as a passivation layer and/or provide a stress buffer for the package configuration 200. According to various embodiments of the present disclosure, the electrically insulative layer 212 has a thickness T3 between about 7 to about 15 microns. Other thicknesses for the electrically insulative layer 212 can be used in other embodiments.

One or more first shielding structures 214 comprising an electrically conductive material are positioned in the electrically insulative layer 212 and electrically coupled to the pad structures 208 using via-type structures 210, as illustrated. The first shielding structures 214 are part of an electrical pathway between the pad structures 208 and the package substrate 224 through components such as under-ball metallization (UBM) structures 216 and solder bumps 220, as illustrated. The first shielding structures 214 are positioned between the solder bumps 220 and the IC devices 204 to shield the IC devices 204 from alpha particles coming from the vicinity of the solder bumps 220. In one embodiment, the electrically insulative layer 212 adheres to at least a portion of each surface of the first shielding structures 214, as illustrated. The first shielding structures 214 can include shapes other than the illustrated shape in other embodiments. For example, the first shielding structures 214 can follow a contour similar to UBM structures 216 in one embodiment.

According to various embodiments of the present disclosure, the first shielding structures 214 comprise a metal, such as, for example, copper, aluminum, nickel, titanium, or tungsten. Other suitable materials can be used in other embodiments. The first shielding structures 214 have a thickness T1 sufficient to block or substantially reduce the passage of alpha particles that strike the first shielding structures 214. Typically alpha particles have energy between about 5.0 mega electron-volts (MeV) and about 8.5 MeV, but can include higher or lower energies. According to various embodiments of the present disclosure, the first shielding structures 214 have a thickness T1 between about 3 to about 10 microns. In one embodiment, the first shielding structures 214 are made of copper and have a thickness T1 of about 5 microns for solder bumps 220 having a diameter, D, of about 120 microns.

A length L1 for the first shielding structures 214 can be selected to balance the tradeoff between an increasing likelihood of stress or delamination issues for a longer length and a decreasing coverage of shielding from alpha particles for a shorter length. In one embodiment, the first shielding structures 214 have a length L1 that is greater than a diameter D of the solder bump 220. The first shielding structures 214 can have other lengths in other embodiments.

The first shielding structures 214 can be formed with one or more slots to reduce a likelihood of delamination according to well-known techniques. For example, slots are typically voids formed in a metal structure (e.g., copper) of a semiconductor product to reduce peeling of surrounding materials from the metal structure. Such "slotting" can be used to mitigate peeling/delamination effects associated with providing a larger thickness T1 and greater length L1 for the first shielding structures 214.

Slotting can be selectively applied to different regions of the semiconductor die (e.g., 102 of FIG. 1). For example, the IC devices 204 can be formed in discrete regions of the semiconductor die (e.g., 102 of FIG. 1), such as diffusion areas (not shown) of embedded memory, while other regions of the semiconductor die do not include IC devices 204. In one embodiment, a greater amount of slotting is used for regions of the semiconductor die (e.g., 102 of FIG. 1) where no IC devices 204 are formed and a lesser amount of slotting or no slotting at all is used for regions of the semiconductor die where IC devices 204 are formed. Such an arrangement provides a package configuration 200 with reduced delamination risk, while still providing increased alpha shielding for the IC devices 204. In another embodiment, alpha shielding (e.g., by first shielding structures 214 and/or second shielding structures 218) is only formed in regions where IC devices 204 are formed.

According to various embodiments of the present disclosure, the first shielding structures 214 further function to redistribute an electrical connection between the solder bumps 220 and the electrically coupled pad structures 208. The first shielding structures 214 can further function to redistribute power between the solder bumps 220, as further described in connection with the package configuration 300 of FIG. 3.

In a configuration where adjacent solder bumps 220 are not designed to have the same electrical potential (e.g., I/O signals), corresponding adjacent first shielding structures 214 are electrically isolated from one another by material of electrically insulative layer 212 that is positioned between the adjacent first shielding structures 214. The distance D1 between the adjacent first shielding structures 214 can be determined according to similar considerations as described previously for the length L1 of the first shielding structures 214, or according to considerations described further below in connection with integrating the first shielding structures 214 and the second shielding structures 218 to block alpha particles together.

The package configuration 200 further includes UBM structures 216 electrically coupled to the first shielding structures 214. The UBM structures 216 typically include a composite film that provides mechanical adhesion and electrical connection to the solder bumps 220. A variety of materials can be used to form the UBM structures 216 including, for example, metals such as copper, aluminum, nickel, titanium, or tungsten. According to various embodiments of the present disclosure, the UBM structures 216 have a thickness between about 3 microns to about 10 microns. In one embodiment, the UBM structures 216 include about 3 microns thickness of nickel, about 5.5 microns thickness of copper, and about 0.1 microns thickness of titanium, coupled together. Other materials can be used to form the UBM structures 216 in other embodiments.

According to various embodiments of the present disclosure, second shielding structures 218 are coupled to a surface of the electrically insulative layer 212 proximal to the solder bumps 220, as illustrated. The second shielding structures 218 are positioned between the solder bumps 220 and the IC devices 204 to shield the IC devices 204 from the alpha particles, as illustrated.

The second shielding structures 218 are electrically isolated from solder bumps 220 adjacent to the second shielding structures 218 by providing a distance D2 between the second shielding structures 218 and the UBM structures 216. The distance D2 is filled with an electrically insulative material, such as, for example, underfill 222.

A length L2 of the second shielding structures 218 can be determined according to considerations already described in connection with the length L1 of the first shielding structures 214. The distance D2 can be determined according to similar considerations as described previously for the length L1 of the first shielding structures 214, or according to considerations described further below in connection with integrating the first shielding structures 214 and the second shielding structures 218 to block alpha particles together. The second shielding structures 218 can further include slotting as described in connection with the first shielding structures 214.

According to various embodiments of the present disclosure, the second shielding structures 218 comprise a metal, such as, for example, copper, aluminum, nickel, titanium, or tungsten. Other suitable materials can be used in other embodiments. The second shielding structures 218 have a thickness T2 sufficient to block or substantially reduce the passage of alpha particles that strike the second shielding structures 218. According to various embodiments of the present disclosure, the second shielding structures 218 have a thickness T2 between about 3 to about 10 microns. In one embodiment, the second shielding structures 218 include copper and have a thickness T2 of about 5 microns for solder bumps 220 having a diameter, D, of about 120 microns.

The second shielding structures 218 can be formed, for example, using the same processes and materials that are used to fabricate the UBM structures 216. In one embodiment, the second shielding structures 218 occupy a same plane as the UBM structures 216, the same plane being substantially parallel with a surface of the UBM structures 216, as illustrated. The second shielding structures 218 are formed on a surface of the electrically insulative layer 212 that forms a plane that is substantially parallel with a plane formed by a surface of the pad structures 208 facing the solder bumps 220, as illustrated.

According to various embodiments of the present disclosure, the second shielding structures 218 and the first shielding structures 214 function together to substantially block alpha particles emitted from the vicinity of the solder bumps 220 from reaching the IC devices 204. For example, any emitted alpha particles from the vicinity of the solder bumps 220 that can pass through the region indicated by distance D2 are blocked by the first shielding structures 214 and any emitted alpha particles that can pass through the region indicated by distance D1 are blocked by the second shielding structures 218. The lengths, L1 and L2, of the respective first and second shielding structures, 214 and 218, can be determined according to the principles previously described to provide more complete alpha shielding for the IC devices 204. In one embodiment, the second shielding structures 218 are positioned relative to the first shielding structures 214 such that emitted alpha particles from the vicinity of the solder bump 220 can not reach the IC devices 204 without passing through at least one of the first shielding structures 214 and the second shielding structures 218.

The solder bumps 220 are electrically coupled to the respective UBM structures 216, as illustrated. The solder bumps 220 can include solderable materials having a variety of alpha particle emission rates, including rates associated with ultra-low alpha solder materials $$\left(\text{e.g., about } 0.001 - 0.002 \ \frac{\text{particles}}{\text{cm}^2 \cdot \text{hr}}\right).$$

In one embodiment, the solder bumps 220 comprise interconnect structures formed by a controlled collapse chip connection (C4) technique. Solder bumps 220 are representative of a variety of other suitable interconnect structures that can benefit from alpha shielding techniques and configurations described herein.

An underfill 222 is deposited to fill a region between the solder bumps 220. The underfill 222 typically comprises an electrically insulative material that provides electrical insulation of the solder bumps 220, protection from potential corrosives (e.g., oxygen and water), and mechanical adhesion for the package configuration 200 in general. For example, the underfill 220 can be coupled to the package substrate 224, the solder bumps 220, the UBM structures 216, and the second shielding structures 218, as illustrated. In an embodiment, the underfill 220 comprises an epoxy, but subject matter is not limited in this regard, and can include a variety of other suitable materials in other embodiments.

The package substrate 224 is electrically coupled to the IC devices 204 via the solder bumps 220. The package configurations 200 and 300 can be implemented according to embodiments already described in connection with the package configuration 100 of FIG. 1 or in connection with each other. Based on the disclosure and teaching provided herein, structures described in connection with the package configurations 100, 200, and 300 can be formed by a variety of semiconductor fabrication processes including, but not limited to, for example, thin film deposition, lithography, etch, polish, implant, diffusion, or metrology.

Figure 3:
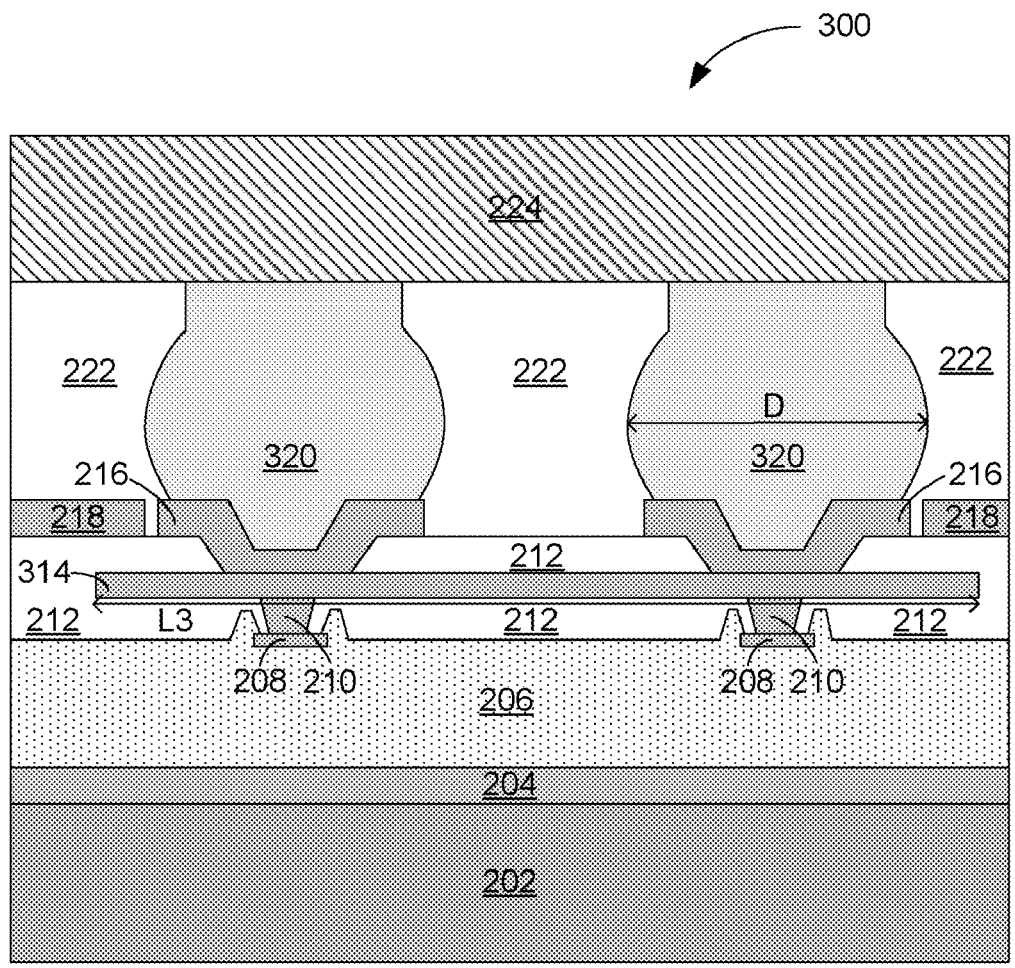
FIG. 3 schematically illustrates an elevation cross-section view of another package configuration, in accordance with various embodiments.

FIG. 3 schematically illustrates an elevation cross-section view of another package configuration 300, in accordance with various embodiments. The package configuration 300 represents a configuration where adjacent solder bumps 320 are designed to have a same electrical potential, sometimes referred to as equipotential. In such a configuration, a first shielding structure 314 has a length L3 such that the first shielding structure 314 electrically connects the adjacent solder bumps 320 (e.g., to redistribute power).

Alpha particles emitted from the vicinity of the solder bumps 320 are substantially blocked by the first shielding structure 314 in a region between equipotential solder bumps 320 and substantially blocked by a combination of the second shielding structures 218 and the first shielding structure 314 (e.g., similar to the package configuration 200 of FIG. 2) in a region external to the equipotential solder bumps 320, as illustrated. In other embodiments, second shielding structures 218 are positioned between equipotential solder bumps 320 to provide additional alpha shielding.

Figure 4:
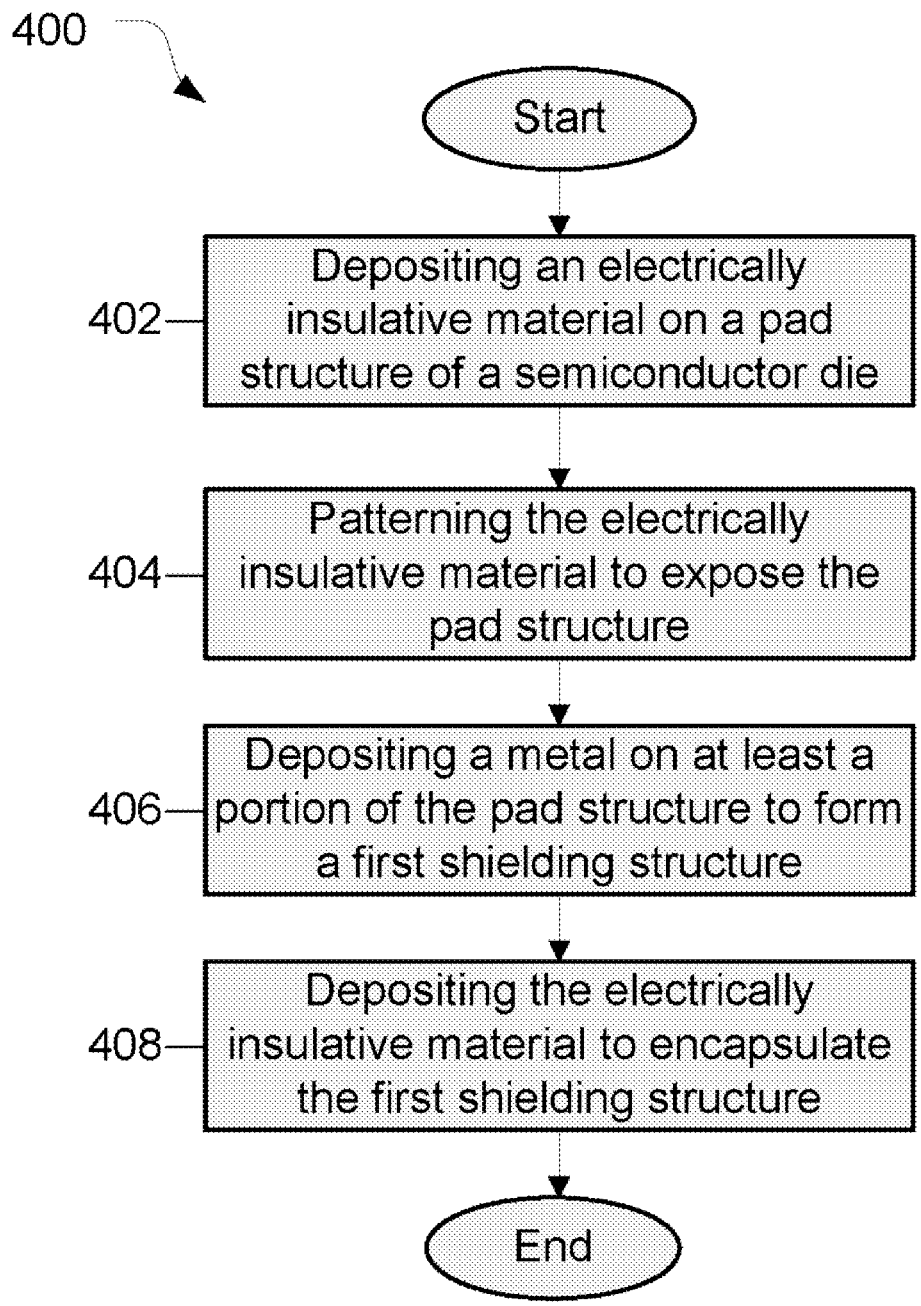
FIG. 4 is a process flow diagram of a method to fabricate a first shielding structure, in accordance with various embodiments.

FIG. 4 is a process flow diagram of a method 400 to fabricate a first shielding structure (e.g., 214 or 314), in accordance with various embodiments. At 402, the method 400 includes depositing an electrically insulative material on one or more pad structures (e.g., 208) of a semiconductor die. The electrically insulative material can be deposited, for example, by coating a surface of the semiconductor die having exposed pad structures. The electrically insulative material (e.g., 212) is further deposited on a top-most surface of interconnect layers (e.g., 206), according to various embodiments of the present disclosure. The electrically insulative material includes materials such as polyimide, but is not limited in this regard. Other suitable materials can be deposited on the pad structure in other embodiments.

At 404, the method 400 includes patterning the electrically insulative material to expose the pad structures. Patterning can include any technique that selectively removes material to expose the pad structures. For example, patterning can include exposing a photo-definable electrically insulative material to light energy to define portions of the electrically insulative material for selective removal. The defined portions of the electrically insulative material may be selectively removed, for example, by a developing process to develop the exposed electrically insulative material. In other embodiments, portions of the electrically insulative material for selective removal are defined using conventional deposition and patterning of photosensitive material on the electrically insulative material. An etch process, for example, can be used to selectively remove portions of the electrically insulative material that are not protected by photosensitive material.

At 406, the method 400 includes depositing a metal on at least a portion of the pad structure to form a first shielding structure. The metal can be selectively deposited according to various embodiments of the present disclosure. For example, selective deposition of the metal can be performed by depositing a seed layer on at least a portion of the exposed pad structure by any suitable technique (e.g., sputtering) and patterning a photosensitive material deposited on the seed layer to define an area for plating. In such example, the seed layer is deposited to conformally cover exposed surfaces of the pad structure and/or the electrically insulative material. Photosensitive material is deposited to cover the seed layer and patterned to define and expose an area for plating the seed layer. The exposed area of the seed layer is plated using the metal to form the first shielding structure. The areas of the electrically insulative material covered by photosensitive material are protected from a plating process. After plating the seed layer to form the first shielding structure, the photosensitive material is removed (e.g., stripped) and any remaining seed layer underlying the removed photosensitive material is removed (e.g., by an etching process).

At 408, the method 400 includes depositing the electrically insulative material to encapsulate the first shielding structure. For example, a material such as polyimide can be deposited to coat the first shielding structure. Such operations provide a first shielding structure that is embedded in the electrically insulative material, the first shielding structure being electrically coupled to the pad structure.

Figure 5:
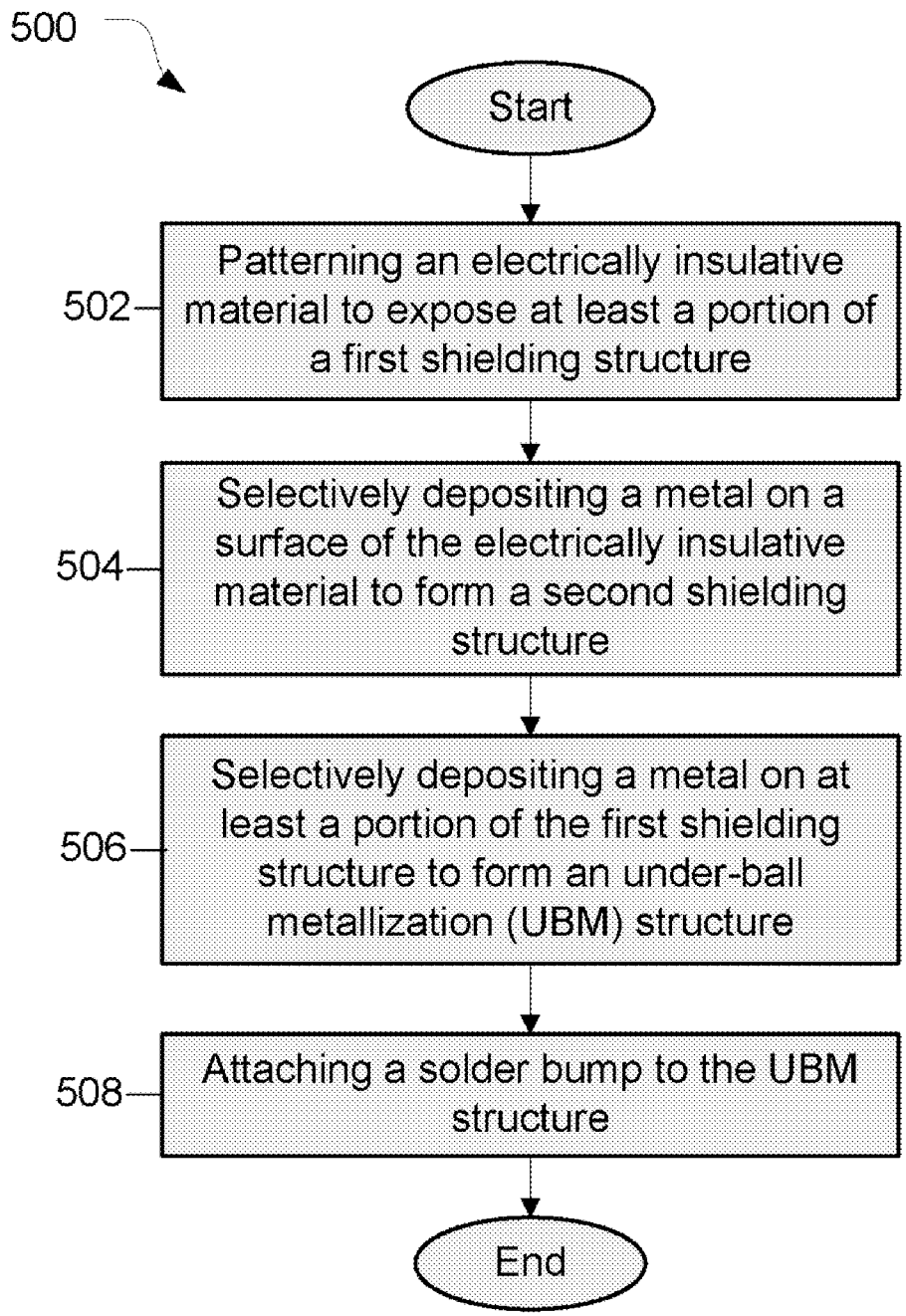
FIG. 5 is a process flow diagram of a method to fabricate a second shielding structure, in accordance with various embodiments.

FIG. 5 is a process flow diagram of a method 500 to fabricate a second shielding structure (e.g., 218), in accordance with various embodiments. At 502, the method 500 includes patterning an electrically insulative material to expose at least a portion of a first shielding structure. Patterning the electrically insulative material can be performed according to similar techniques previously described, e.g., in connection with block 404 of method 400. In one embodiment, the electrically insulative material patterned at 502 is the same electrically insulative material deposited at 408 of method 400. In other embodiments, a first shielding structure is not formed at all and the electrically insulative material is patterned at 502 to expose at least a portion of a pad structure (e.g., 208) instead of a first shielding structure. According to various embodiments of the present disclosure, the electrically insulative material deposited at 402 and 408 of method 400 is cured after patterning the electrically insulative material to expose at least a portion of the first shielding structure.

At 504, the method 500 includes selectively depositing a metal on a surface of the electrically insulative material to form a second shielding structure (e.g., 218). At 506, the method 500 includes selectively depositing a metal on at least a portion of the first shielding structure to form an under-ball metallization (UBM) structure (e.g., 216). In an embodiment, a first shielding structure is not formed at all and the metal is selectively deposited on the pad structure.

Selectively depositing the metal on the surface of the electrically insulative material to form the second shielding at 504 and selectively depositing the metal on at least a portion of the first shielding structure to form the under-ball metallization (UBM) structure at 506 can be simultaneously performed (e.g., during a same deposition operation). For example, a seed layer is deposited to conformally cover exposed surfaces on at least a portion of the first shielding structure or the pad structure and on the electrically insulative material. A photosensitive material such as a dry resist film is deposited on the seed layer and patterned to define areas for plating the seed layer. The areas for plating include regions where the photosensitive material is removed to expose the seed layer. The exposed seed layer is plated using the metal to simultaneously form the UBM structure on the first shielding structure and the second shielding structure on the electrically insulative material. During plating, the photosensitive material can serve as a barrier to allow the metal to fill exposed regions in the photosensitive material to a desired height. The photosensitive material is removed by an etch process after plating.

At 508, method 500 includes attaching a solder bump to the UBM structure. A solderable material capable of emitting alpha particles is deposited to form the solder bump on the UBM structure using any suitable technique including, for example, a solder plating process. A patterning technique as previously described in connection with selectively depositing the metal on the electrically insulative material and the first shielding structure to form the respective second shielding structure and UBM structure can be used to selectively deposit the solder bump material on the UBM structure. For example, a photosensitive material such as a dry resist film can be used for such patterning. The photosensitive material is deposited and portions of the photosensitive material are selectively removed to expose the UBM structure. The solderable material is then deposited on the UBM structure using, for example, a plating process or any other suitable deposition technique. After plating, the photosensitive material is removed.

A solder reflow process is applied to the deposited solderable material to form the solder bump. A flux clean process generally follows the solder reflow. Other operations associated with fabrication of back-end interconnect structures such as solder bumps can be performed. The methods 400 and 500 described herein can be used to form package configurations described herein (e.g., 100, 200, or 300). Structures formed by metal can include different metals, composites, and/or alloys.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus, comprising:
   a semiconductor die having a plurality of integrated circuit devices;
   an interconnect layer disposed on the semiconductor die;
   a pad structure electrically coupled to at least one integrated circuit device of the plurality of integrated circuit devices via the interconnect layer;
   an electrically insulative layer disposed on the interconnect layer;
   a first shielding structure disposed within the electrically insulative layer, the first shielding structure further being electrically coupled to the pad structure;
   an under-ball metallization (UBM) structure electrically coupled to the first shielding structure; and
   a solder bump electrically coupled to the UBM structure, the solder bump comprising a solder bump material capable of emitting alpha particles, wherein the first shielding structure is positioned between the solder bump and the plurality of integrated circuit devices to shield the plurality of integrated circuit devices from the alpha particles emitted from the solder bump material.

2. The apparatus of claim 1, wherein the first shielding structure further functions to redistribute power between the solder bump and other solder bumps.

3. The apparatus of claim 1, wherein the electrically insulative layer comprises polyimide, the electrically insulative layer having a thickness between about 7 to about 15 microns; and wherein the first shielding structure comprises at least one of copper, aluminum, nickel, titanium, and tungsten, the first shielding structure having a thickness between about 3 microns to about 10 microns.

4. The apparatus of claim 1, wherein the first shielding structure comprises a length that is greater than a diameter of the solder bump.

5. The apparatus of claim 1, further comprising a second shielding structure coupled to a surface of the electrically insulative layer proximal to the solder bump, wherein the second shielding structure is electrically isolated from the solder bump, and wherein the second shielding structure is positioned to shield the plurality of integrated circuit devices from the alpha particles emitted from the solder bump material.

6. The apparatus of claim 5, further comprising:
a package substrate electrically coupled to the plurality of integrated circuit devices via the solder bump; and
an underfill material used to facilitate electrical isolation of the second shielding structure from the solder bump.

7. The apparatus of claim 5, wherein the second shielding structure occupies a plane that is substantially parallel with a surface of the UBM structure, the second shielding structure comprising at least one of copper, aluminum, nickel, titanium, and tungsten, and the second shielding structure having a thickness between about 3 to about 10 microns.

8. The apparatus of claim 5, wherein the second shielding structure is positioned relative to the first shielding structure to substantially block the alpha particles emitted from the solder bump material from reaching the plurality of integrated circuit devices by at least one of the first shielding structure and the second shielding structure.

9. The apparatus of claim 1, wherein the plurality of integrated circuit devices comprise memory cells.

10. The apparatus of claim 1, wherein the solder bump material comprises at least one of lead (Pb) and tin (Sn), the solder bump material having an alpha particle flux greater than about $$0.001 \frac{\text{particles}}{\text{cm}^2 \cdot \text{hr}}.$$

* * * * *